United States Patent
Lee

(10) Patent No.: US 11,152,042 B2
(45) Date of Patent: Oct. 19, 2021

(54) INVERSION SIGNAL GENERATION CIRCUIT

(71) Applicant: SK hynix Inc., Gyeonggi-do (KR)

(72) Inventor: Dong Uk Lee, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/988,167

(22) Filed: Aug. 7, 2020

(65) Prior Publication Data

US 2021/0174849 A1 Jun. 10, 2021

(30) Foreign Application Priority Data

Dec. 10, 2019 (KR) .................. 10-2019-0163766

(51) Int. Cl.
G11C 7/10 (2006.01)
G06F 13/42 (2006.01)
H03M 5/14 (2006.01)

(52) U.S. Cl.
CPC ........ G11C 7/1087 (2013.01); G06F 13/4243 (2013.01); G11C 7/1009 (2013.01); H03M 5/145 (2013.01)

(58) Field of Classification Search
CPC . G11C 7/1087; G11C 7/1009; G06F 13/4243; H03M 5/145
USPC ........................................................ 711/104
See application file for complete search history.

(56) References Cited

U.S. PATENT DOCUMENTS

| 6,992,506 | B2* | 1/2006 | Park | H03K 19/00346 |
| | | | | 326/52 |
| 9,142,269 | B2* | 9/2015 | Hein | G11C 7/1009 |
| 9,774,328 | B2 | 9/2017 | Yoon | |
| 10,884,969 | B2* | 1/2021 | Muljono | G06F 13/4072 |
| 10,964,702 | B2* | 3/2021 | Narui | G11C 11/4074 |
| 2019/0354132 | A1* | 11/2019 | Vergis | G11C 5/04 |
| 2020/0044669 | A1* | 2/2020 | Cha | H03M 13/09 |
| 2020/0286534 | A1* | 9/2020 | Choi | G11C 29/36 |

* cited by examiner

Primary Examiner — Fernando Hidalgo
(74) Attorney, Agent, or Firm — IP & T Group LLP

(57) ABSTRACT

An inversion signal generation circuit may include a transition detection signal generation circuit suitable for generating first to fourth transition detection signals, a first XOR gate suitable for receiving a fourth inversion signal and the first transition detection signal, and generating a first pre-inversion signal, a second XOR gate suitable for receiving the first pre-inversion signal and the second transition detection signal, and generating a second pre-inversion signal, a third XOR gate suitable for receiving the second transition detection signal and the third transition detection signal, a fourth XOR gate suitable for receiving the first pre-inversion signal and an output signal of the third XOR gate, and generating a third pre-inversion signal, a fifth XOR gate suitable for receiving the third pre-inversion signal and the fourth transition detection signal, and generating a fourth pre-inversion signal, and a first alignment circuit suitable for generating first to fourth inversion signals.

10 Claims, 6 Drawing Sheets

INVERSION SIGNAL GENERATION CIRCUIT

CROSS-REFERENCE TO RELATED APPLICATION

This application claims priority under 35 U.S.C. § 119 to Korean Patent Application No. 10-2019-0163766 filed on Dec. 10, 2019, which is incorporated herein by reference in its entirety.

BACKGROUND

1. Field

Various embodiments relate to a semiconductor design technology, and more particularly, to a circuit for generating an inversion signal.

2. Discussion of the Related Art

In general, various signals (data) are transmitted/received between a memory and a memory controller. A path through which the signals are transmitted/received is referred to as a channel. Various types of signals may be transferred through the channel, and problems may occur during a high-speed operation. For example, when data transferred through the channel transition many times, current consumption is increased to cause noise.

In order to overcome such a problem, the DBI (Data Bus Inversion) technology is used. The DBI technology is a technology for reducing the number of data transitions. For example, when four or less bits transition in the case that 8-bit data is transmitted, the data may be transmitted as it is. When five or more bits transition, the data may be inverted and transmitted. Thus, the number of transitioning bits in the data may always be retained as four or less bits.

FIG. 1 is a diagram illustrating a method for transmitting/receiving data using the DBI technology.

FIG. 1 illustrates the case in which 8-bit data is transmitted. In FIG. 1, reference numeral 110 represents an operation of a transmitting end, and reference numeral 120 represents an operation of a receiving end.

First, the transmitting end may determine the number of transitions in transmitted data, in step 111. When the number of transitions is five or more (Yes in step S113), an inversion signal DBI may be set to '1', and the transmitted data may be inverted, in step 115. When the number of transitions is less than five (No in step S113), the inversion signal DBI may be set to '0', and the transmitted data may not be inverted, in step 117.

When the inversion signal DBI is '1', the receiving end may invert the data and receive the inverted data, in step 121. When the inversion signal DBI is '0', the receiving end may not invert the data, but receive the data as it is, in step 123.

SUMMARY

Various embodiments are directed to a technology for efficiently designing an inversion signal generation circuit.

In an embodiment, an inversion signal generation circuit may include: a transition detection signal generation circuit suitable for generating first to fourth transition detection signals using first to fourth phase data each including multi-bit data; a first XOR gate suitable for receiving a fourth inversion signal and the first transition detection signal, and generating a first pre-inversion signal; a second XOR gate suitable for receiving the first pre-inversion signal and the second transition detection signal, and generating a second pre-inversion signal; a third XOR gate suitable for receiving the second transition detection signal and the third transition detection signal; a fourth XOR gate suitable for receiving the first pre-inversion signal and an output signal of the third XOR gate, and generating a third pre-inversion signal; a fifth XOR gate suitable for receiving the third pre-inversion signal and the fourth transition detection signal, and generating a fourth pre-inversion signal; and a first alignment circuit suitable for generating a first inversion signal, a second inversion signal, a third inversion signal and the fourth inversion signal by aligning the first to fourth pre-inversion signals.

In an embodiment, an inversion signal generation circuit may include: a transition detection signal generation circuit suitable for generating first to eighth transition detection signals using first to eighth phase data each including multi-bit data; a first XOR gate suitable for receiving an eighth inversion signal and the first transition detection signal, and generating a first pre-inversion signal; a second XOR gate suitable for receiving the first pre-inversion signal and the second transition detection signal, and generating a second pre-inversion signal; a third XOR gate suitable for receiving the second transition detection signal and the third transition detection signal; a fourth XOR gate suitable for receiving the first pre-inversion signal and an output signal of the third XOR gate, and generating a third pre-inversion signal; a fifth XOR gate suitable for receiving the third pre-inversion signal and the fourth transition detection signal, and generating a fourth pre-inversion signal; a sixth XOR gate suitable for receiving the fourth transition detection signal and the fifth transition detection signal; a seventh XOR gate suitable for receiving the third pre-inversion signal and an output signal of the sixth XOR gate, and generating a fifth pre-inversion signal; an eighth XOR gate suitable for receiving the output signal of the sixth XOR gate and the sixth transition detection signal; a ninth XOR gate suitable for receiving the third pre-inversion signal and an output signal of the eighth XOR gate, and generating a sixth pre-inversion signal; a tenth XOR gate suitable for receiving the sixth transition detection signal and the seventh transition detection signal; an 11th XOR gate suitable for receiving the output signal of the sixth XOR gate and an output signal of the tenth XOR gate; a 12th XOR gate suitable for receiving the third pre-inversion signal and an output signal of the 11th XOR gate, and generating a seventh pre-inversion signal; a 13th XOR gate suitable for receiving the seventh pre-inversion signal and the eighth transition detection signal, and generating an eighth pre-inversion signal; and a first alignment circuit suitable for generating first to seventh inversion signals and the eighth inversion signal by aligning the first to eighth pre-inversion signals.

In an embodiment, an operation method of a circuit may include: generating first to fourth transition detection signals based on first to fourth phase data each including multi-bit data; generating a first pre-inversion signal through a XOR operation on a fourth inversion signal and the first transition detection signal; generating a second pre-inversion signal through a XOR operation on the first pre-inversion signal and the second transition detection signal; generating an intermediate signal through a XOR operation on the second transition detection signal and the third transition detection signal;

generating a third pre-inversion signal through a XOR operation on the first pre-inversion signal and the intermediate signal; generating a fourth pre-inversion signal through a XOR operation on the third pre-inversion signal and the fourth transition detection signal; and generating first to third inversion signals and the fourth inversion signal by aligning the first to fourth pre-inversion signals.

In an embodiment, an operation method of a circuit may include: generating first to eighth transition detection signals based on first to eighth phase data each including multi-bit data; generating a first pre-inversion signal through a XOR operation on an eighth inversion signal and the first transition detection signal; generating a second pre-inversion signal through a XOR operation on the first pre-inversion signal and the second transition detection signal; generating a first intermediate signal through a XOR operation on the second transition detection signal and the third transition detection signal; generating a third pre-inversion signal through a XOR operation on the first pre-inversion signal and the first intermediate signal; generating a fourth pre-inversion signal through a XOR operation on the third pre-inversion signal and the fourth transition detection signal; generating a second intermediate signal through a XOR operation on the fourth transition detection signal and the fifth transition detection signal; generating a fifth pre-inversion signal through a XOR operation on the third pre-inversion signal and the second intermediate signal; generating a third intermediate signal through a XOR operation on the second intermediate signal and the sixth transition detection signal; generating a sixth pre-inversion signal through a XOR operation on the third pre-inversion signal and the third intermediate signal; generating a fourth intermediate signal through a XOR operation on the sixth transition detection signal and the seventh transition detection signal; generating a fifth intermediate signal through a XOR operation on the second intermediate signal and the fourth intermediate signal; generating a seventh pre-inversion signal through a XOR operation on the third pre-inversion signal and the fifth intermediate signal; generating an eighth pre-inversion signal through a XOR operation on the seventh pre-inversion signal and the eighth transition detection signal; and generating first to seventh inversion signals and the eighth inversion signal by aligning the first to eighth pre-inversion signals.

In accordance with the present embodiments, it is possible to efficiently design an inversion signal generation circuit.

DETAILED DESCRIPTION

Figure 1:
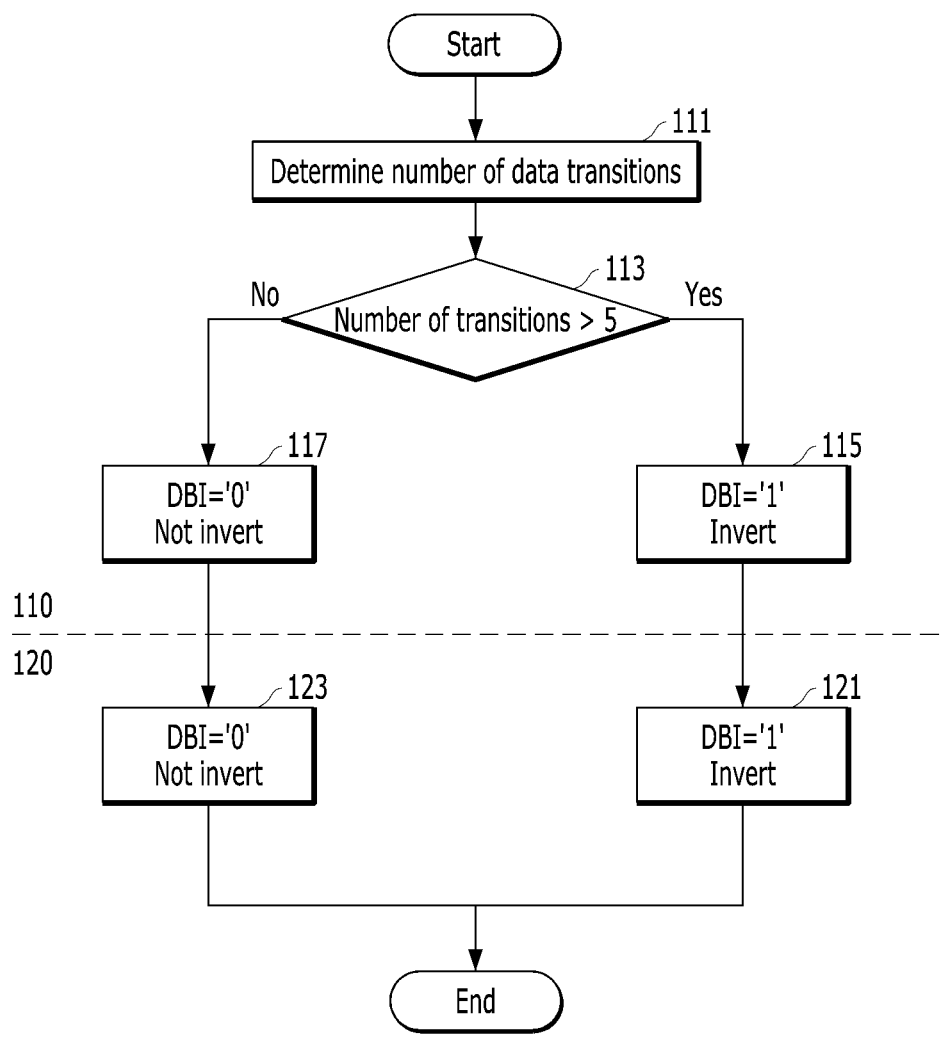
FIG. 1 is a diagram illustrating a method for transmitting/receiving data using conventional DBI technology.

Hereafter, various embodiments will be described with reference to the accompanying drawings, such that a person skilled in the art to which the present disclosure pertains can easily carry out the technical ideas of the present disclosure. In the descriptions of the present embodiment, components which are irrelevant to the purpose of the present embodiment may be omitted. When reference numbers are given to components of the drawings, the same components will be represented by like reference numerals even though the components are illustrated in different drawings.

Figure 2:
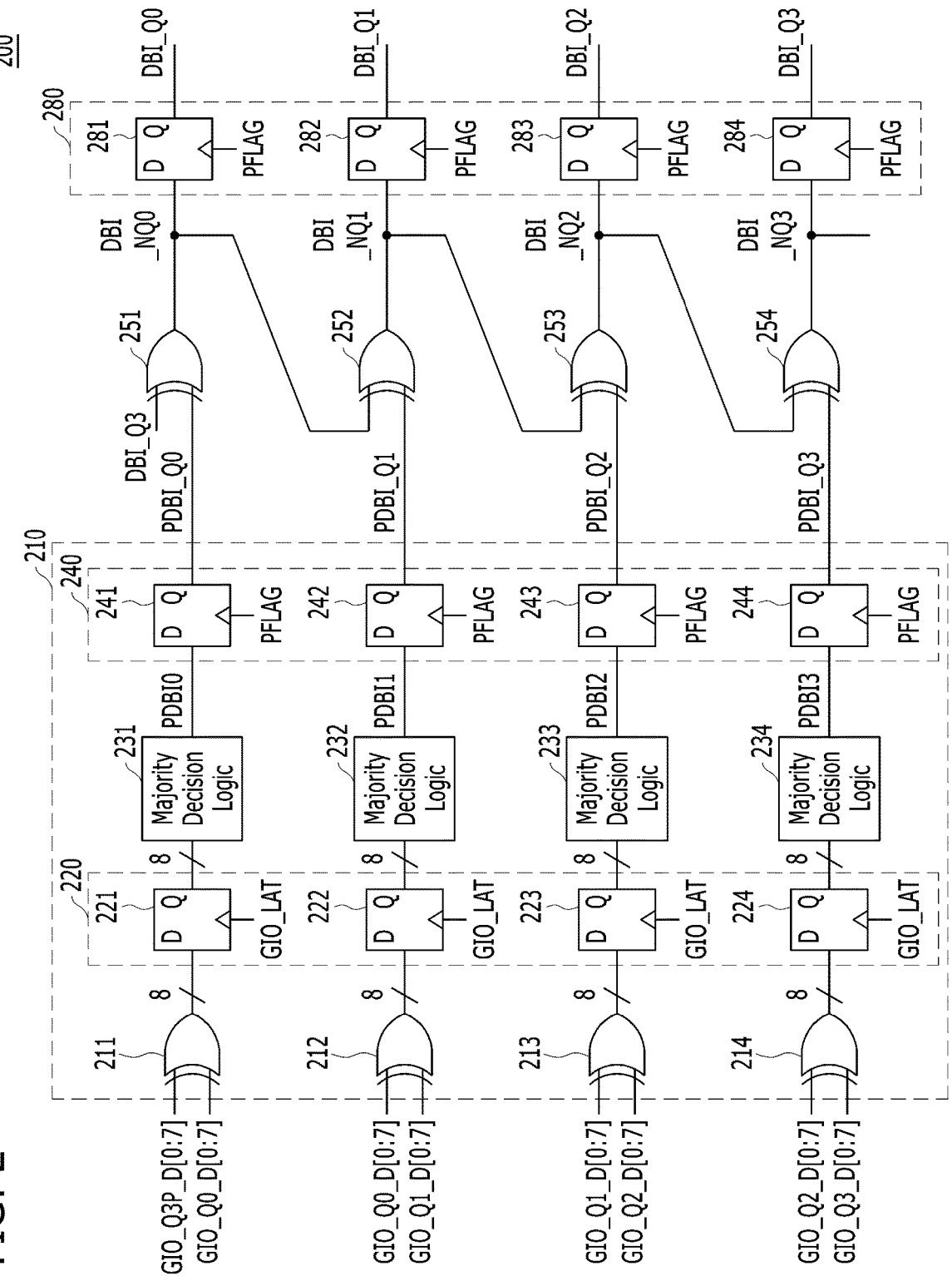
FIG. 2 is a configuration diagram illustrating an inversion signal generation circuit 200 in accordance with a first embodiment of the present disclosure.

FIG. 2 is a configuration diagram illustrating an inversion signal generation circuit 200 in accordance with a first embodiment of the present disclosure.

Referring to FIG. 2, the inversion signal generation circuit 200 may include a transition detection signal generation circuit 210, XOR gates 251 to 254 and an alignment circuit 280.

The transition detection signal generation circuit 210 may generate first to fourth transition detection signals PDBI_Q0 to PDBI_Q3 using first to fourth phase data GIO_Q0_D[0:7] to GIO_Q3_D[0:7] each including multi-bit data. Each of the first to fourth phase data GIO_Q0_D[0:7] to GIO_Q3_D[0:7] may include 8-bit data. The second phase data GIO_Q1_D[0:7] may be outputted to a channel after the first phase data GIO_Q0_D[0:7] is outputted to the channel, the third phase data GIO_Q2_D[0:7] may be outputted to the channel after the second phase data GIO_Q1_D[0:7] is outputted to the channel, and the fourth phase data GIO_Q3_D[0:7] may be outputted to the channel after the third phase data GIO_Q2_D[0:7] is outputted to the channel. The first transition detection signal PDBI_Q0 may be generated by detecting the number of transitions from the previous data GIO_Q3P_D[0:7] to the first phase data GIO_Q0_D[0:7], the second transition detection signal PDBI_Q1 may be generated by detecting the number of transitions from the first phase data GIO_Q0_D[0:7] to the second phase data GIO_Q1_D[0:7], the third transition detection signal PDBI_Q2 may be generated by detecting the number of transitions from the second phase data GIO_Q1_D[0:7] to the third phase data GIO_Q2_D[0:7], and the fourth transition detection signal PDBI_Q3 may be generated by detecting the number of transitions from the third phase data GIO_Q2_D[0:7] to the fourth phase data GIO_Q3_D[0:7].

The transition detection signal generation circuit 210 may include XOR gates 211 to 214, alignment circuits 220 and 240 and majority decision logics 231 to 234.

The XOR gates 211 to 214 may be used to detect data transition. The XOR gate 211 may detect a transition from the previous fourth phase data GIO_Q3P_D[0:7] to the first phase data GIO_Q0_D[0:7]. The previous fourth phase data may indicate the fourth phase data in one cycle before the current fourth phase data GIO_Q3_D[0:7]. FIG. 2 illustrates one XOR gate 211, but the XOR gate 211 may include eight XOR gates. In other words, the XOR gate 211 may include an XOR gate for comparing GIO_Q3P_D[0] and GIO_Q0_D[0], an XOR gate for comparing GIO_Q3P_D[1] and GIO_Q0_D[1], an XOR gate for comparing GIO_Q3P_D[2] and GIO_Q0_D[2], an XOR gate for comparing GIO_Q3P_D[3] and GIO_Q0_D[3], an XOR gate for comparing GIO_Q3P_D[4] and GIO_Q0_D[4], an XOR gate for comparing GIO_Q3P_D[5] and GIO_Q0_D[5], an XOR gate for comparing GIO_Q3P_D[6] and GIO_Q0_D[6], and an XOR gate for comparing GIO_Q3P_D[7] and GIO_Q0_D[7].

Similarly, the XOR gate 212 may include eight XOR gates for detecting a transition from the first phase data GIO_Q0_D[0:7] to the second phase data GIO_Q1_D[0:7], the XOR gate 213 may include eight XOR gates for detecting a transition from the second phase data GIO_Q1_D[0:7] to the third phase data GIO_Q2_D[0:7], and the XOR gate 214 may include eight XOR gates for detecting a transition from the third phase data GIO_Q2_D[0:7] to the fourth phase data GIO_Q3_D[0:7].

The alignment circuit 220 may align output signals of the XOR gates in response to a signal GIO_LAT. The alignment circuit 220 may include D flip-flops 221 to 224 which operate in response to the signal GIO_LAT. Each of the D flip-flops 221 to 224 may include eight D flip-flops.

The majority decision logics 231 to 234 may generate first to fourth pre-transition detection signals PDBI0 to PDBI3 by determining whether the numbers of transitions detected by the corresponding XOR gates 211 to 214 are equal to or more than a preset or set number. The majority decision logic 231 may generate the first pre-transition detection signal PDBI0 by determining whether the number of 1's among eight signals outputted from the eight D flip-flops 221 is five or more. When the first pre-transition detection signal PDBI0 is '1', it may indicate that the number of transitions from the previous fourth phase data GIO_Q3P_D[0:7] to the first phase data GIO_Q0_D[0:7] is five or more. When the first pre-transition detection signal PDBI0 is '0', it may indicate that the number of transitions from the previous fourth phase data GIO_Q3P_D[0:7] to the first phase data GIO_Q0_D[0:7] is four or less. The majority decision logic 232 may generate the second pre-transition detection signal PDBI1 by determining whether the number of 1's among eight signals outputted from the eight D flip-flops 222 is five or more. The majority decision logic 233 may generate the third pre-transition detection signal PDBI2 by determining whether the number of 1's among eight signals outputted from the eight D flip-flops 223 is five or more. The majority decision logic 234 may generate the fourth pre-transition detection signal PDBI3 by determining whether the number of 1's among eight signals outputted from the eight D flip-flops 224 is five or more.

The alignment circuit 240 may generate the first to fourth transition detection signals PDBI_Q0 to PDBI_Q3 by aligning the first to fourth pre-transition detection signals PDBI0 to PDBI3 in response to an alignment signal PFLAG. The alignment circuit 240 may include D flip-flops 241 to 244 which operate in response to the alignment signal PFLAG.

The XOR gates 251 to 254 may generate first to fourth pre-inversion signals DBI_NQ0 to DBI_NQ3 using the first to fourth transition detection signals PDBI_Q0 to PDBI_Q3, the first to third pre-inversion signals DBI_NQ0 to DBI_NQ2 and a fourth inversion signal DBI_Q3.

The XOR gate 251 may receive the fourth inversion signal DBI_Q3 and the first transition detection signal PDBI_Q0, and output the first pre-inversion signal DBI_NQ0. Since the fourth pre-inversion signal DBI_NQ3 becomes the fourth inversion signal DBI_Q3 after one cycle, the fourth inversion signal DBI_Q3 may be considered as the fourth pre-inversion signal DBI_NQ3 in the previous cycle. The XOR gate 252 may receive the first pre-inversion signal DBI_NQ0 and the second transition detection signal PDBI_Q1, and output the second pre-inversion signal DBI_NQ1. The XOR gate 253 may receive the second pre-inversion signal DBI_NQ1 and the third transition detection signal PDBI_Q2, and output the third pre-inversion signal DBI_NQ2. The XOR gate 254 may receive the third pre-inversion signal DBI_NQ2 and the fourth transition detection signal PDBI_Q3, and output the fourth pre-inversion signal DBI_NQ3.

When the first to fourth phase data GIO_Q0_D[0:7] to GIO_Q3_D[0:7] are outputted to the channel, the first to fourth phase data GIO_Q0_D[0:7] to GIO_Q3_D[0:7] may be inverted by first to fourth inversion signals DBI_Q0 to DBI_Q3 or non-inverted, and then outputted. Therefore, it is necessary to consider the previous inversion signals using the XOR gates 251 to 254, when the first to fourth inversion signals DBI_Q0 to DBI_Q3 are generated. For example, when the second inversion signal DBI_Q1 for inverting/non-inverting the second phase data GIO_Q1_D[0:7] is generated, it may be necessary to consider whether the first phase data GIO_Q0_D[0:7] immediately before the second phase data GIO_Q1_D[0:7] was inverted or non-inverted when transmitted to the channel. For this operation, the XOR gate 252 may be present.

The alignment circuit 280 may generate the first to fourth inversion signals DBI_Q0 to DBI_Q3 by aligning the first to fourth pre-inversion signals DBI_NQ0 to DBI_NQ3 in response to the alignment signal PFLAG. The alignment circuit 280 may include D flip-flops 281 to 284 which operate in response to the alignment signal PFLAG. The first phase data GIO_Q0_D[0:7] may be inverted or non-inverted and transmitted to the channel according to the level of the first inversion signal DBI_Q0, the second phase data GIO_Q1_D[0:7] may be inverted or non-inverted and transmitted to the channel according to the level of the second inversion signal DBI_Q1, the third phase data GIO_Q2_D[0:7] may be inverted or non-inverted and transmitted to the channel according to the level of the third inversion signal DBI_Q2, and the fourth phase data GIO_Q3_D[0:7] may be inverted or non-inverted and transmitted to the channel according to the level of the fourth inversion signal DBI_Q3.

Figure 3:
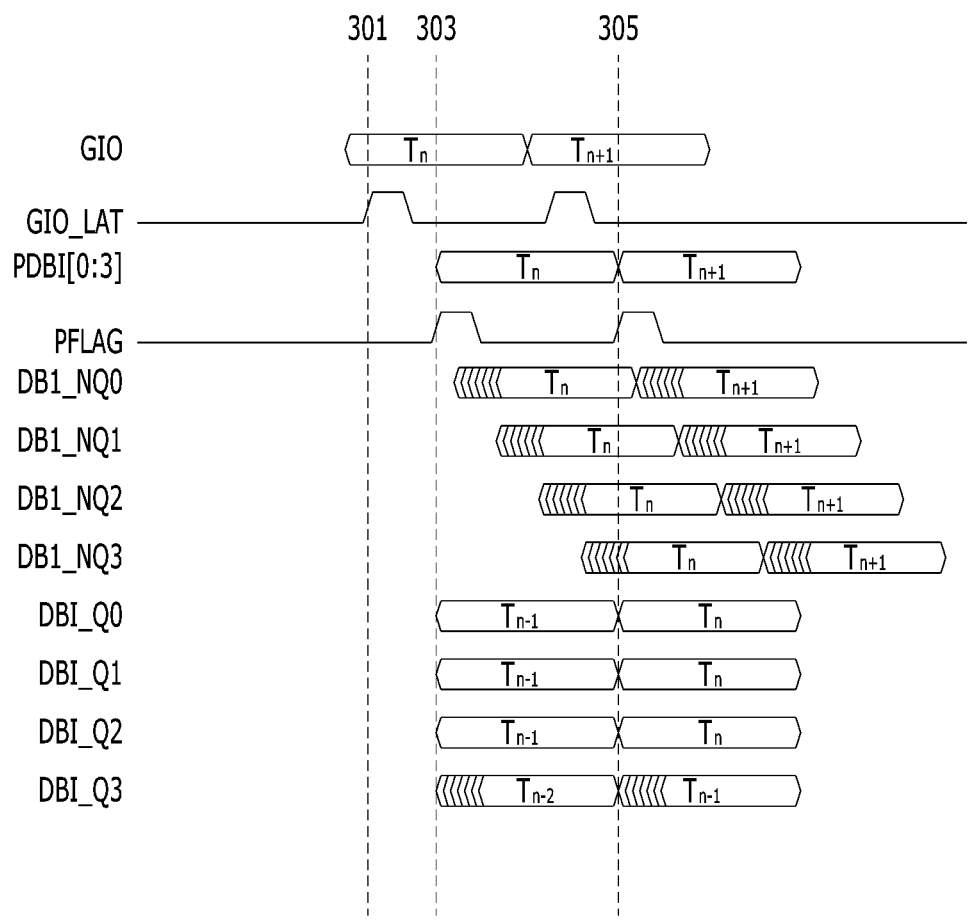
FIG. 3 is a timing diagram illustrating an operation of the inversion signal generation circuit 200 of FIG. 2.

FIG. 3 is a timing diagram illustrating an operation of the inversion signal generation circuit 200 of FIG. 2.

In FIG. 3, $T_{n-1}$ may represent a signal in an $(n-1)^{th}$ cycle, $T_n$ may represent a signal in an $n^{th}$ cycle, and $T_{n+1}$ may represent a signal in an $(n+1)^{th}$ cycle.

In FIG. 3, GIO may represent output signals of the XOR gates 211 to 214. When the signal GIO_LAT is enabled at a time point '301', the output signals of the XOR gates 211 to 214 may be latched by the alignment circuit 220, and the latched signals may be transferred to the majority decision logics 231 to 234. The first to fourth pre-transition detection signals PDBI0 to PDBI3 may be generated through voting delays 302 of the majority decision logics 231 to 234.

When the alignment signal PFLAG is enabled at a time point '303', the alignment circuit 240 may generate the first to fourth transition detection signals PDBI_Q0 to PDBI_Q3 by latching the first to fourth pre-transition detection signals PDBI0 to PDBI3, and the XOR gates 251 to 254 may generate the first to fourth pre-inversion signals DBI_NQ0 to DBI_NQ3 using the first to fourth transition detection signals PDBI_Q0 to PDBI_Q3. The first to fourth pre-inversion signals DBI_NQ0 to DBI_NQ3 of the XOR gates 251 to 254 may be sequentially generated. That is, the first pre-inversion signal DBI_NQ0 may be first generated, the second pre-inversion signal DBI_NQ1 may be generated by using the first pre-inversion signal DBI_NQ0, the third pre-inversion signal DBI_NQ2 may be generated by using the second pre-inversion signal DBI_NQ1, and the fourth pre-inversion signal DBI_NQ3 may be generated by using the third pre-inversion signal DBI_NQ2. Therefore, a large delay may occur between the first to fourth pre-inversion signals DBI_NQ0 to DBI_NQ3.

When the alignment signal PFLAG is enabled at a time point '305', the alignment circuit 280 may generate the first to fourth inversion signals DBI_Q0 to DBI_Q3 by latching the first to fourth pre-inversion signals DBI_NQ0 to DBI_NQ3. However, due to the delays of the XOR gates 251 to 254, the fourth pre-inversion signal DBI_NQ3 may not be generated until the time point '305'. In this case, the fourth pre-inversion signal DBI_NQ3 may become a signal in a cycle different from the other pre-inversion signals DBI_NQ0 to DBI_NQ2. That is, there occurs a fail in which the first to third pre-inversion signals DBI_NQ0 to DBI_NQ2 are generated as signals in the $(n-1)^{th}$ cycle and only the fourth pre-inversion signal DBI_NQ3 is generated as a signal in the $n^{th}$ cycle. Such a fail occurs because many delays are accompanied when the pre-inversion signals DBI_NQ0 to DBI_NQ3 are generated by the XOR gates 251 to 254. Thus, such delays need to be reduced.

Figure 4:
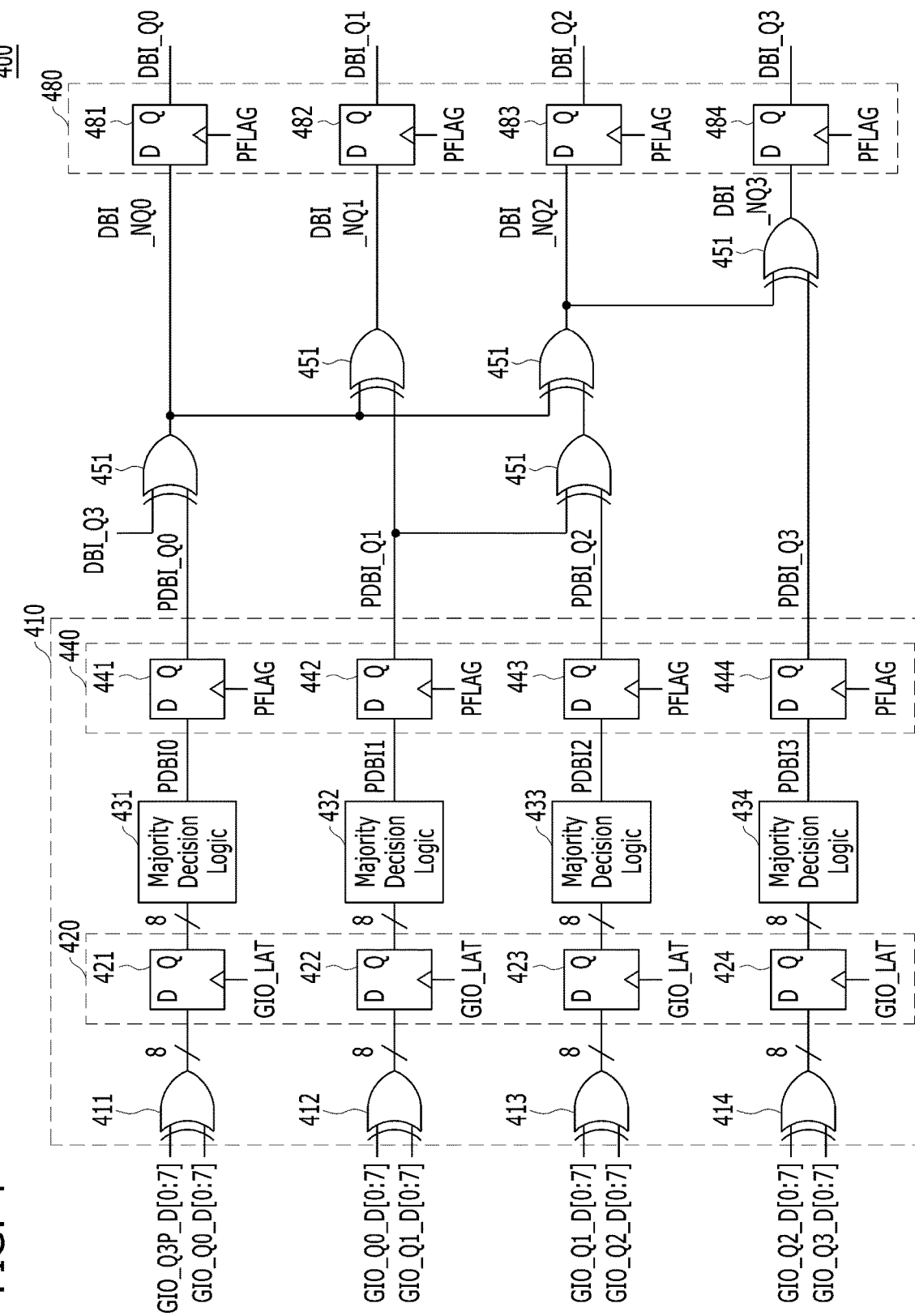
FIG. 4 is a configuration diagram illustrating an inversion signal generation circuit 400 in accordance with a second embodiment of the present disclosure.

FIG. 4 is a configuration diagram illustrating an inversion signal generation circuit 400 in accordance with a second embodiment of the present disclosure.

Referring to FIG. 4, the inversion signal generation circuit 400 may include a transition detection signal generation circuit 410, XOR gates 451 to 455, and an alignment circuit 480.

The transition detection signal generation circuit 410 may generate first to fourth transition detection signals PDBI_Q0 to PDBI_Q3 respectively using first to fourth phase data GIO_Q0_D[0:7] to GIO_Q3_D[0:7] each including multi-bit data. The first transition detection signal PDBI_Q0 may be generated by detecting the number of transitions from the previous data GIO_Q3P_D[0:7] to the first phase data GIO_Q0_D[0:7], the second transition detection signal PDBI_Q1 may be generated by detecting the number of transitions from the first phase data GIO_Q0_D[0:7] to the second phase data GIO_Q1_D[0:7], the third transition detection signal PDBI_Q2 may be generated by detecting the number of transitions from the second phase data GIO_Q1_D[0:7] to the third phase data GIO_Q2_D[0:7], and the fourth transition detection signal PDBI_Q3 may be generated by detecting the number of transitions from the third phase data GIO_Q2_D[0:7] to the fourth phase data GIO_Q3_D[0:7]. The transition detection signal generation circuit 410 may include XOR gates 411 to 414, alignment circuits 420 and 440, and majority decision logics 431 to 434, like the transition detection signal generation circuit 210 of FIG. 2.

The XOR gates 451 to 455 may generate first to fourth pre-inversion signals DBI_NQ0 to DBI_NQ3 using the first to fourth transition detection signals PDBI_Q0 to PDBI_Q3, the first and third pre-inversion signals DBI_NQ0 and DBI_NQ2 and a fourth inversion signal DBI_Q3. Since the XOR gates 251 to 254 of FIG. 2 are coupled in series and sequentially generate the first to fourth pre-inversion signals DBI_NQ0 to DBI_NQ3, many delays occur until the fourth pre-inversion signal DBI_NQ3 is generated. The XOR gates 451 to 455 of FIG. 4 may perform the same operation as the XOR gates 251 to 254 of FIG. 2. However, the XOR gates 451 to 455 of FIG. 4 may be coupled in parallel and reduce delay values until the fourth pre-inversion signal DBI_NQ3 is generated.

The XOR gate 451 may receive the fourth inversion signal DBI_Q3 and the first transition detection signal PDBI_Q0, and generate the first pre-inversion signal DBI_NQ0. The XOR gate 452 may receive the first pre-inversion signal DBI_NQ0 and the second transition detection signal PDBI_Q1, and generate the second pre-inversion signal DBI_NQ1. The XOR gate 453 may receive the second transition detection signal PDBI_Q1 and the third transition detection signal PDBI_Q2. The XOR gate 454 may receive the first pre-inversion signal DBI_NQ0 and the output signal of the XOR gate 453, and generate the third pre-inversion signal DBI_NQ2. The XOR gate 455 may receive the third pre-inversion signal DBI_NQ2 and the fourth transition detection signal PDBI_Q3, and generate the fourth pre-inversion signal DBI_NQ3.

The alignment circuit 480 may generate first to fourth inversion signals DBI_Q0 to DBI_Q3 by aligning the first to fourth pre-inversion signals DBI_NQ0 to DBI_NQ3 in response to the alignment signal PFLAG. The alignment circuit 480 may include D flip-flops 481 to 484 which operate in response to an alignment signal PFLAG.

In FIG. 2, the fourth pre-inversion signal DBI_NQ3 is generated after passing through the four-stage delay of the XOR gates 251 to 254. In FIG. 4, however, the fourth pre-inversion signal DBI_NQ3 is generated after passing through the three-stage delay of the XOR gates 451, 454 and 455. Thus, it is possible to prevent a fail from occurring due to the delays of the XOR gates 251 to 254 as illustrated in FIG. 3.

Figure 5:
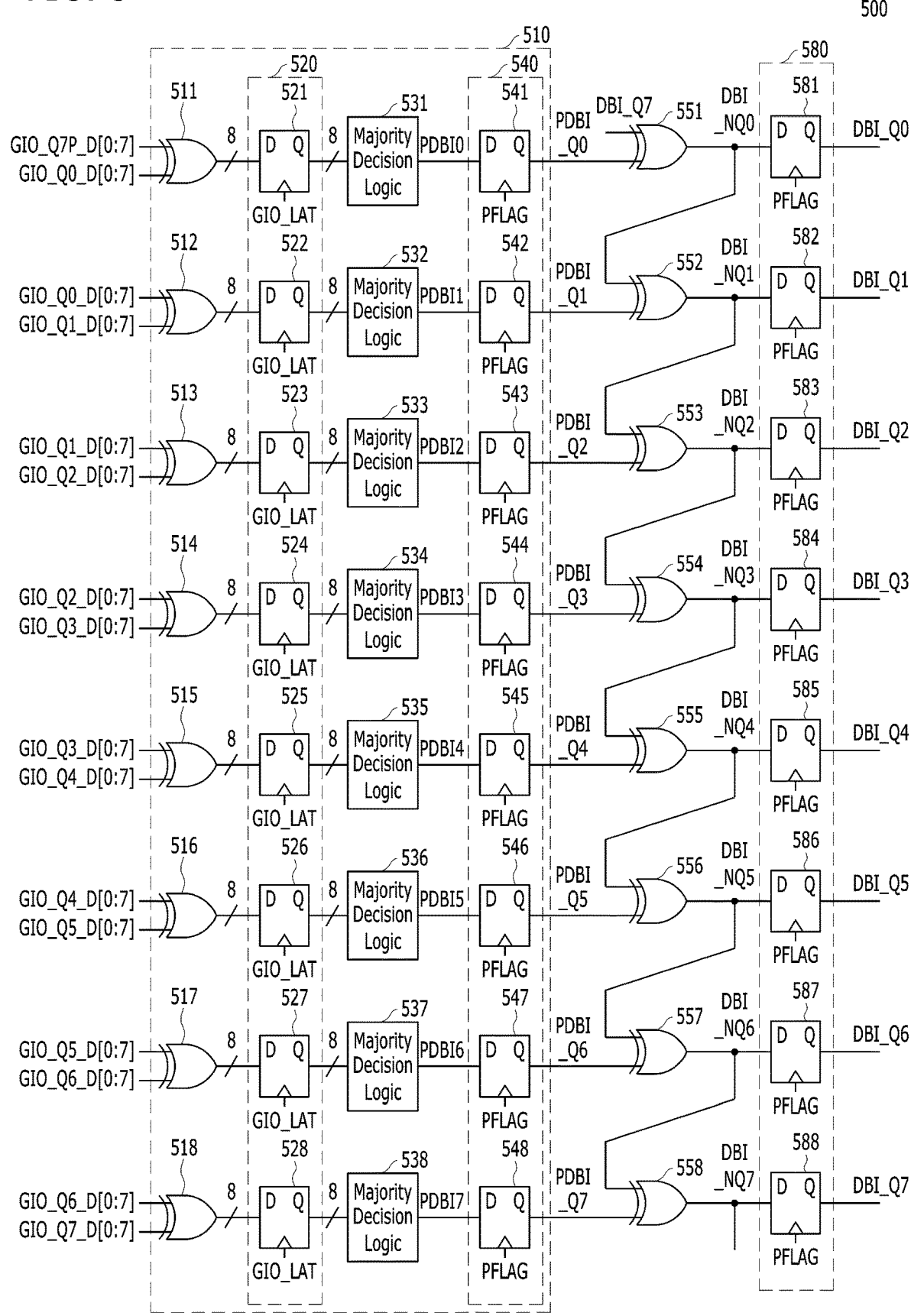
FIG. 5 is a configuration diagram illustrating an inversion signal generation circuit 500 in accordance with a third embodiment of the present disclosure.

FIG. 5 is a configuration diagram illustrating an inversion signal generation circuit 500 in accordance with a third embodiment of the present disclosure. FIG. 5 illustrates an inversion signal generation circuit which generates inversion signals of 8-phase data, not 4-phase data as illustrated in FIG. 2.

Referring to FIG. 5, the inversion signal generation circuit 500 may include a transition detection signal generation circuit 510, XOR gates 551 to 558 and an alignment circuit 580.

The transition detection signal generation circuit 510 may generate first to seventh transition detection signals PDBI_Q0 to PDBI_Q7 respectively using first to eighth phase data GIO_Q0_D[0:7] to GIO_Q7_D[0:7] each including multi-bit data. Each of the first to eighth phase data GIO_Q0_D[0:7] to GIO_Q7_D[0:7] may include 8-bit data. Through the channel, data may be outputted in order of the first phase data GIO_Q0_D[0:7], the second phase data GIO_Q1_D[0:7], the third phase data GIO_Q2_D[0:7], the fourth phase data GIO_Q3_D[0:7], the fifth phase data GIO_Q4_D[0:7], the sixth phase data GIO_Q5_D[0:7], the seventh phase data GIO_Q6_D[0:7] and the eighth phase data GIO_Q7_D[0:7]. The first transition detection signal PDBI_Q0 may be generated by detecting the number of transitions from the previous data GIO_Q7P_D[0:7] to the first phase data GIO_Q0_D[0:7], the second transition detection signal PDBI_Q1 may be generated by detecting the number of transitions from the first phase data GIO_Q0_D[0:7] to the second phase data GIO_Q1_D[0:7], the third transition detection signal PDBI_Q2 may be generated by detecting the number of transitions from the second phase data GIO_Q1_D[0:7] to the third phase data GIO_Q2_D[0:7], the fourth transition detection signal PDBI_Q3 may be generated by detecting the number of transitions from the third phase data GIO_Q2_D[0:7] to the fourth phase data GIO_Q3_D[0:7], the fifth transition detection signal PDBI_Q4 may be generated by detecting the number of transitions from the fourth phase data GIO_Q3_D[0:7] to the fifth phase data GIO_Q4_D[0:7], the sixth transition detection signal PDBI_Q5 may be generated by detecting the number of transitions from the fifth phase data GIO_Q4_D[0:7] to the sixth phase data GIO_Q5_D[0:7], the seventh transition detection signal PDBI_Q6 may be generated by detecting the number of transitions from the sixth phase data GIO_Q5_D[0:7] to the seventh phase data GIO_Q6_D[0:7], and the eighth transition detection signal PDBI_Q7 may be generated by detecting the number of transitions from the seventh phase data GIO_Q6_D[0:7] to the eighth phase data GIO_Q7_D[0:7].

The transition detection signal generation circuit 510 may include XOR gates 511 to 518, alignment circuits 520 and 540 and majority decision logics 531 to 538. The transition detection signal generation circuit 510 may be configured and operated in the same manner as the transition detection signal generation circuit 210, except for the number of the components.

The XOR gates 551 to 558 may generate first to eighth pre-inversion signals DBI_NQ0 to DBI_NQ7 using the first to eighth transition detection signals PDBI_Q0 to PDBI_Q7, the first to seventh pre-inversion signals DBI_NQ0 to DBI_NQ6 and an eighth inversion signal DBI_Q7. Since the XOR gates 551 to 558 are coupled in series and sequentially generate the first to eighth pre-inversion signals DBI_NQ0 to DBI_NQ7, many delays may occur until the eighth pre-inversion signal DBI_NQ7 is generated. That is, the eighth pre-inversion signal DBI_NQ7 may pass through the eight-stage delay of the XOR gates 551 to 558, until the eighth pre-inversion signal DBI_NQ7 is generated.

The alignment circuit 580 may generate first to eighth inversion signals DBI_Q0 to DBI_Q7 by aligning the first to eighth pre-inversion signals DBI_NQ0 to DBI_NQ7 in response to an alignment signal PFLAG. The alignment circuit 580 may include D flip-flops 581 to 588 which operate in response to the alignment signal PFLAG.

Figure 6:
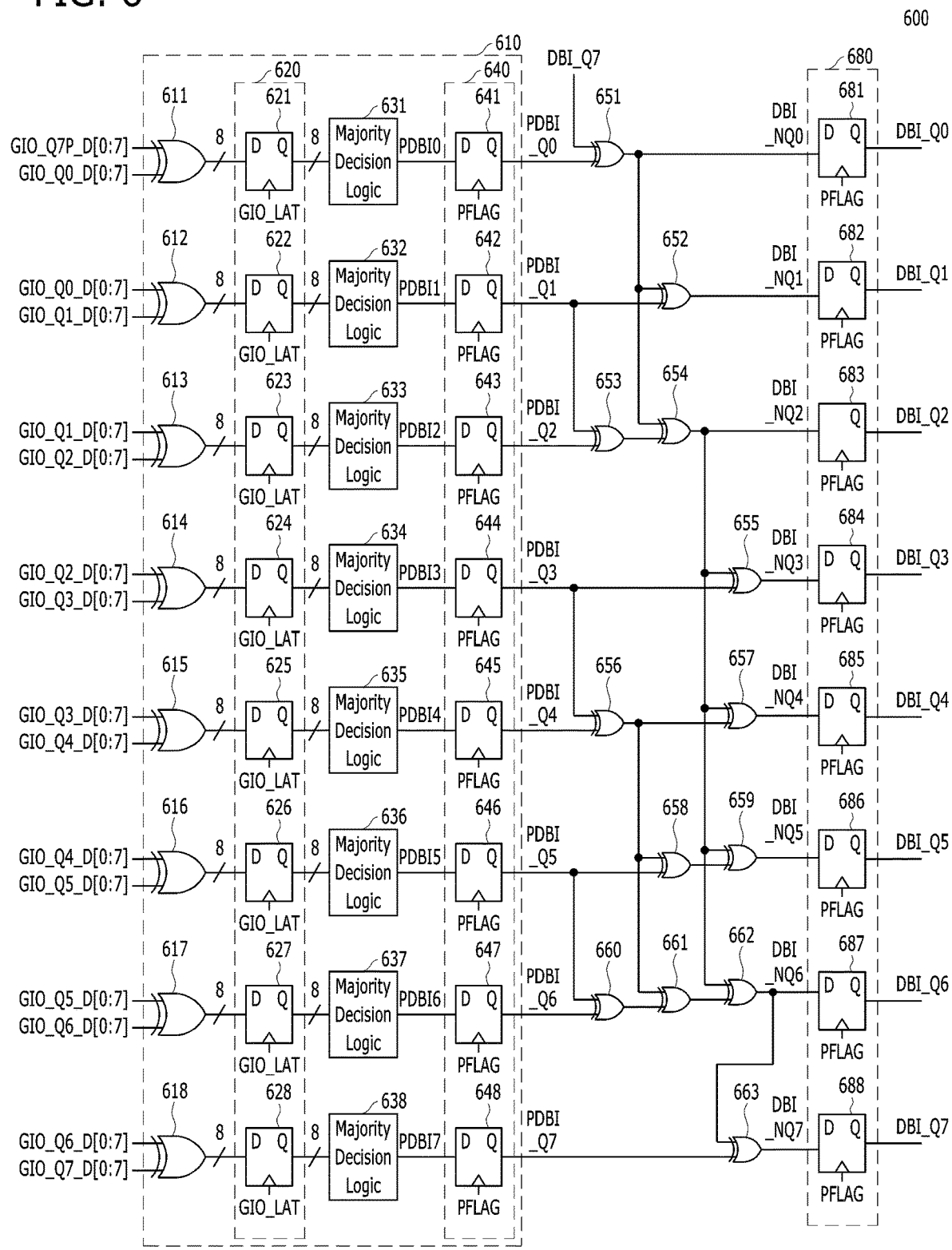
FIG. 6 is a configuration diagram illustrating an inversion signal generation circuit 600 in accordance with a fourth embodiment of the present disclosure.

FIG. 6 is a configuration diagram illustrating an inversion signal generation circuit 600 in accordance with a fourth embodiment of the present disclosure.

Referring to FIG. 6, the inversion signal generation circuit 600 may include a transition detection signal generation circuit 610, XOR gates 651 to 663 and an alignment circuit 680.

The transition detection signal generation circuit 610 may be configured and operated in the same manner as the transition detection signal generation circuit 510 of FIG. 5.

The XOR gates 651 to 663 may generate first to eighth pre-inversion signals DBI_NQ0 to DBI_NQ7 using first to eighth transition detection signals PDBI_Q0 to PDBI_Q7, the first, third and seventh pre-inversion signals DBI_NQ0, DBI_NQ2 and DBI_NQ6 and an eighth inversion signal DBI_Q7. Since the XOR gates 551 to 558 of FIG. 5 are coupled in series and sequentially generate the first to eighth pre-inversion signals DBI_NQ0 to DBI_NQ7, many delays occur until the eighth pre-inversion signal DBI_NQ7 is generated. The XOR gates 651 to 663 of FIG. 6 may perform the same operation as the XOR gates 551 to 558 of FIG. 5. However, the XOR gates 651 to 663 of FIG. 6 may be coupled in parallel and reduce delay values until the eighth pre-inversion signal DBI_NQ7 is generated.

The XOR gate 651 may receive the eighth inversion signal DBI_Q7 and the first transition detection signal PDBI_Q0, and generate the first pre-inversion signal DBI_NQ0. The XOR gate 652 may receive the first pre-inversion signal DBI_NQ0 and the second transition detection signal PDBI_Q1, and generate the second pre-inversion signal DBI_NQ1. The XOR gate 653 may receive the second transition detection signal PDBI_Q1 and the third transition detection signal PDBI_Q2. The XOR gate 654 may receive the first pre-inversion signal DBI_NQ0 and the output signal of the XOR gate 653, and generate the third pre-inversion signal DBI_NQ2. The XOR gate 655 may receive the third pre-inversion signal DBI_NQ2 and the fourth transition detection signal PDBI_Q3, and generate the fourth pre-inversion signal DBI_NQ3. The XOR gate 656 may receive the fourth transition detection signal PDBI_Q3 and the fifth transition detection signal PDBI_Q4. The XOR gate 657 may receive the third pre-inversion signal DBI_NQ2 and the output signal of the XOR gate 656, and generate the fifth pre-inversion signal DBI_NQ4. The XOR gate 658 may receive the output signal of the XOR gate 656 and the sixth transition detection signal PDBI_Q5. The XOR gate 659 may receive the third pre-inversion signal DBI_NQ2 and the output signal of the XOR gate 658, and generate the sixth pre-inversion signal DBI_NQ5. The XOR gate 660 may receive the sixth transition detection signal PDBI_Q5 and the seventh transition detection signal PDBI_Q6. The XOR gate 661 may receive the output signal of the XOR gate 656 and the output signal of the XOR gate 660. The XOR gate 662 may receive the third pre-inversion signal DBI_NQ2 and the output signal of the XOR gate 661, and generate the seventh pre-inversion signal DBI_NQ6. The XOR gate 663 may receive the seventh pre-inversion signal DBI_NQ6 and the eighth transition detection signal PDBI_Q7, and generate the eighth pre-inversion signal DBI_NQ7.

The alignment circuit 680 may generate first to eighth inversion signals DBI_Q0 to DBI_Q7 by aligning the first to eighth pre-inversion signals DBI_NQ0 to DBI_NQ7 in response to an alignment signal PFLAG. The alignment circuit 680 may include D flip-flops 681 to 688 which operate in response to the alignment signal PFLAG.

In FIG. 5, the eighth inversion signal DBI_NQ7 is generated after passing through the eight-stage delay of the XOR gates 551 to 558. In FIG. 6, however, the eighth inversion signal DBI_NQ7 may be generated after passing through the four-stage delay of the XOR gates 651, 654, 662 and 663.

Although various embodiments have been described for illustrative purposes, it will be apparent to those skilled in the art that various changes and modifications may be made without departing from the spirit and scope of the disclosure as defined in the following claims.

What is claimed is:

1. An inversion signal generation circuit comprising:
   a transition detection signal generation circuit suitable for generating first to fourth transition detection signals using first to fourth phase data each including multi-bit data;
   a first XOR gate suitable for receiving a fourth inversion signal and the first transition detection signal, and generating a first pre-inversion signal;
   a second XOR gate suitable for receiving the first pre-inversion signal and the second transition detection signal, and generating a second pre-inversion signal;
   a third XOR gate suitable for receiving the second transition detection signal and the third transition detection signal;
   a fourth XOR gate suitable for receiving the first pre-inversion signal and an output signal of the third XOR gate and generating a third pre-inversion signal;
   a fifth XOR gate suitable for receiving the third pre-inversion signal and the fourth transition detection signal and generating a fourth pre-inversion signal; and
   a first alignment circuit suitable for generating a first inversion signal, a second inversion signal, a third inversion signal and the fourth inversion signal by aligning the first to fourth pre-inversion signals.

2. The inversion signal generation circuit of claim 1, wherein the transition detection signal generation circuit generates:
   the first transition detection signal by detecting a number of transitions between multi-bit data of a previous fourth phase data and the multi-bit data of the first phase data, the second transition detection signal by detecting a number of transitions between the multi-bit data of the first phase data and the multi-bit data of the second phase data, the third transition detection signal by detecting a number of transitions between the multi-bit data of the second phase data and the multi-bit data of the third phase data, and the fourth transition detection signal by detecting a number of transitions between the multi-bit data of the third phase data and the multi-bit data of the fourth phase data.

3. The inversion signal generation circuit of claim 1, wherein the transition detection signal generation circuit comprises:

eight sixth XOR gates suitable for detecting transitions between 8-bit data of the previous fourth phase data and 8-bit data of the first phase data;

eight seventh XOR gates suitable for detecting transitions between the 8-bit data of the first phase data and 8-bit data of the second phase data;

eight eighth XOR gates suitable for detecting transitions between the 8-bit data of the second phase data and 8-bit data of the third phase data;

eight ninth XOR gates suitable for detecting transitions between the 8-bit data of the third phase data and 8-bit data of the fourth phase data;

a first majority decision logic suitable for generating a first pre-transition detection signal by determining whether the number of transitions detected by the eight sixth XOR gates is equal to or more than a set number;

a second majority decision logic suitable for generating a second pre-transition detection signal by determining whether the number of transitions detected by the eight seventh XOR gates is equal to or more than the set number;

a third majority decision logic suitable for generating a third pre-transition detection signal by determining whether the number of transitions detected by the eight eighth XOR gates is equal to or more than the set number;

a fourth majority decision logic suitable for generating a fourth pre-transition detection signal by determining whether the number of transitions detected by the eight ninth XOR gates is equal to or more than the set number; and a second alignment circuit suitable for generating the first to fourth transition detection signals by aligning the first to fourth pre-transition detection signals in response to an alignment signal.

4. The inversion signal generation circuit of claim 3, wherein the first alignment circuit generates the first to fourth inversion signals by aligning the first to fourth pre-inversion signals in response to the alignment signal.

5. An inversion signal generation circuit comprising:

a transition detection signal generation circuit suitable for generating first to eighth transition detection signals using first to eighth phase data each including multi-bit data;

a first XOR gate suitable for receiving an eighth inversion signal and the first transition detection signal, and generating a first pre-inversion signal;

a second XOR gate suitable for receiving the first pre-inversion signal and the second transition detection signal, and generating a second pre-inversion signal;

a third XOR gate suitable for receiving the second transition detection signal and the third transition detection signal;

a fourth XOR gate suitable for receiving the first pre-inversion signal and an output signal of the third XOR gate, and generating a third pre-inversion signal;

a fifth XOR gate suitable for receiving the third pre-inversion signal and the fourth transition detection signal, and generating a fourth pre-inversion signal;

a sixth XOR gate suitable for receiving the fourth transition detection signal and the fifth transition detection signal;

a seventh XOR gate suitable for receiving the third pre-inversion signal and an output signal of the sixth XOR gate, and generating a fifth pre-inversion signal;

an eighth XOR gate suitable for receiving the output signal of the sixth XOR gate and the sixth transition detection signal;

a ninth XOR gate suitable for receiving the third pre-inversion signal and an output signal of the eighth XOR gate, and generating a sixth pre-inversion signal;

a tenth XOR gate suitable for receiving the sixth transition detection signal and the seventh transition detection signal;

an eleventh XOR gate suitable for receiving the output signal of the sixth XOR gate and an output signal of the tenth XOR gate;

a twelfth XOR gate suitable for receiving the third pre-inversion signal and an output signal of the 11th XOR gate, and generating a seventh pre-inversion signal;

a thirteenth XOR gate suitable for receiving the seventh pre-inversion signal and the eighth transition detection signal, and generating an eighth pre-inversion signal; and a first alignment circuit suitable for generating first to seventh inversion signals and the eighth inversion signal by aligning the first to eighth pre-inversion signals.

6. The inversion signal generation circuit of claim 5, wherein the transition detection signal generation circuit generates:

the first transition detection signal by detecting a number of transitions between multi-bit data of a previous eighth phase data and the multi-bit data of the first phase data, the second transition detection signal by detecting a number of transitions between the multi-bit data of the first phase data and the multi-bit data of the second phase data, the third transition detection signal by detecting a number of transitions between the multi-bit data of the second phase data and the multi-bit data of the third phase data, the fourth transition detection signal by detecting a number of transitions between the multi-bit data of the third phase data and the multi-bit data of the fourth phase data, the fifth transition detection signal by detecting a number of transitions between the multi-bit data of the fourth phase data and the multi-bit data of the fifth phase data, the sixth transition detection signal by detecting a number of transitions between the multi-bit data of the fifth phase data and the multi-bit data of the sixth phase data, the seventh transition detection signal by detecting a number of transitions between the multi-bit data of the sixth phase data and the multi-bit data of the seventh phase data, and the eighth transition detection signal by detecting a number of transitions between the multi-bit data of the seventh phase data and the multi-bit data of the eighth phase data.

7. The inversion signal generation circuit of claim 5, wherein the transition detection signal generation circuit comprises:
eight fourteenth XOR gates suitable for detecting transitions between 8-bit data of the previous eighth phase data and 8-bit data of the first phase data;
eight fifteenth XOR gates suitable for detecting transitions between the 8-bit data of the first phase data and 8-bit data of the second phase data;
eight sixteenth XOR gates suitable for detecting transitions between the 8-bit data of the second phase data and 8-bit data of the third phase data;
eight seventeenth XOR gates suitable for detecting transitions between the 8-bit data of the third phase data and 8-bit data of the fourth phase data;
eight eighteenth XOR gates suitable for detecting transitions between the 8-bit data of the fourth phase data and 8-bit data of the fifth phase data;
eight nineteenth XOR gates suitable for detecting transitions between the 8-bit data of the fifth phase data and 8-bit data of the sixth phase data;
eight twentieth XOR gates suitable for detecting transitions between the 8-bit data of the sixth phase data and 8-bit data of the seventh phase data;
eight twenty-first XOR gates suitable for detecting transitions between the 8-bit data of the seventh phase data and 8-bit data of the eighth phase data;
a first majority decision logic suitable for generating a first pre-transition detection signal by determining whether the number of transitions detected by the eight fourteenth XOR gates is equal to or more than a set number;
a second majority decision logic suitable for generating a second pre-transition detection signal by determining whether the number of transitions detected by the eight fifteenth XOR gates is equal to or more than the set number;
a third majority decision logic suitable for generating a third pre-transition detection signal by determining whether the number of transitions detected by the eight sixteenth XOR gates is equal to or more than the set number;
a fourth majority decision logic suitable for generating a fourth pre-transition detection signal by determining whether the number of transitions detected by the eight seventeenth XOR gates is equal to or more than the set number;
a fifth majority decision logic suitable for generating a fifth pre-transition detection signal by determining whether the number of transitions detected by the eight eighteenth XOR gates is equal to or more than the set number;
a sixth majority decision logic suitable for generating a sixth pre-transition detection signal by determining whether the number of transitions detected by the eight nineteenth XOR gates is equal to or more than the set number;
a seventh majority decision logic suitable for generating a seventh pre-transition detection signal by determining whether the number of transitions detected by the eight twentieth XOR gates is equal to or more than the set number;
an eighth majority decision logic suitable for generating an eighth pre-transition detection signal by determining whether the number of transitions detected by the eight twenty-first XOR gates is equal to or more than the set number; and
a second alignment circuit suitable for generating the first to eighth transition detection signals by aligning the first to eighth pre-transition detection signals in response to an alignment signal.

8. The inversion signal generation circuit of claim 7, wherein the first alignment circuit generates the first to eighth inversion signals by aligning the first to eighth pre-inversion signals in response to the alignment signal.

9. An operating method of a circuit, the operating method comprising:
generating first to fourth transition detection signals based on first to fourth phase data each including multi-bit data;
generating a first pre-inversion signal through a XOR operation on a fourth inversion signal and the first transition detection signal;
generating a second pre-inversion signal through a XOR operation on the first pre-inversion signal and the second transition detection signal;
generating an intermediate signal through a XOR operation on the second transition detection signal and the third transition detection signal;
generating a third pre-inversion signal through a XOR operation on the first pre-inversion signal and the intermediate signal;
generating a fourth pre-inversion signal through a XOR operation on the third pre-inversion signal and the fourth transition detection signal; and
generating first to third inversion signals and the fourth inversion signal by aligning the first to fourth pre-inversion signals.

10. An operating method of a circuit, the operating method comprising:
generating first to eighth transition detection signals based on first to eighth phase data each including multi-bit data;
generating a first pre-inversion signal through a XOR operation on an eighth inversion signal and the first transition detection signal;
generating a second pre-inversion signal through a XOR operation on the first pre-inversion signal and the second transition detection signal;
generating a first intermediate signal through a XOR operation on the second transition detection signal and the third transition detection signal;
generating a third pre-inversion signal through a XOR operation on the first pre-inversion signal and the first intermediate signal;
generating a fourth pre-inversion signal through a XOR operation on the third pre-inversion signal and the fourth transition detection signal;
generating a second intermediate signal through a XOR operation on the fourth transition detection signal and the fifth transition detection signal;
generating a fifth pre-inversion signal through a XOR operation on the third pre-inversion signal and the second intermediate signal;
generating a third intermediate signal through a XOR operation on the second intermediate signal and the sixth transition detection signal;

generating a sixth pre-inversion signal through a XOR operation on the third pre-inversion signal and the third intermediate signal;

generating a fourth intermediate signal through a XOR operation on the sixth transition detection signal and the seventh transition detection signal;

generating a fifth intermediate signal through a XOR operation on the second intermediate signal and the fourth intermediate signal;

generating a seventh pre-inversion signal through a XOR operation on the third pre-inversion signal and the fifth intermediate signal;

generating an eighth pre-inversion signal through a XOR operation on the seventh pre-inversion signal and the eighth transition detection signal; and generating first to seventh inversion signals and the eighth inversion signal by aligning the first to eighth pre-inversion signals.

\* \* \* \* \*